(12) United States Patent
Hamano

(10) Patent No.: US 6,366,463 B2
(45) Date of Patent: Apr. 2, 2002

(54) COOLING MECHANISM, HEAT SINK, ELECTRONIC EQUIPMENT AND FABRICATION METHOD THEREFOR

(75) Inventor: Takeshi Hamano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/749,459

(22) Filed: Dec. 28, 2000

(30) Foreign Application Priority Data

Apr. 27, 2000 (JP) ........................................ 2000-128518

(51) Int. Cl.[7] ................................................ H05K 7/20
(52) U.S. Cl. ...................... 361/704; 361/689; 361/700; 361/707; 257/714; 257/715; 174/15.1; 174/15.2; 165/80.4
(58) Field of Search .................... 361/687, 688–690, 361/698–699, 700; 257/712–715; 174/15.2, 16.1, 16.3; 165/80.2, 80.3, 80.4

(56) References Cited

U.S. PATENT DOCUMENTS

| | | | | |
|---|---|---|---|---|
| 5,598,320 A | * | 1/1997 | Toedtman et al. | 361/687 |
| 5,835,348 A | * | 11/1998 | Ishida | 361/699 |
| 5,875,095 A | * | 2/1999 | Webb | 361/700 |
| 6,134,106 A | * | 10/2000 | Tao et al. | 361/687 |
| 6,166,906 A | * | 12/2000 | Sun et al. | 361/697 |
| 6,189,602 B1 | * | 2/2001 | Tanahashi et al. | 165/86 |
| 6,226,177 B1 | * | 5/2001 | Rude et al. | 361/687 |
| 6,233,146 B1 | * | 5/2001 | Gilchrist et al. | 361/687 |

FOREIGN PATENT DOCUMENTS

| | | |
|---|---|---|
| JP | 08-316384 | 11/1996 |
| JP | 10-107468 | 4/1998 |

* cited by examiner

*Primary Examiner*—Leo P. Picard
*Assistant Examiner*—Boris L. Chervinsky
(74) *Attorney, Agent, or Firm*—Armstrong, Westerman & Hattori, LLP

(57) ABSTRACT

The apparatus provided with a heatsink (21) being in contact with an electronic component (16), a heat radiation plate (20) for radiating heat, a heat conduction member (22) for transferring heat in the heat sink to the radiation plate, and connection mechanisms (21-1 and 21-2) for connecting the heat sink and the heat conduction member and separating the heat sink and the heat conduction member. This connection mechanism enables to maintain small heat conduction resistance between the heat sink and the electronic component and also between heat sink and heat conduction member. Cooling capability can be prevented from decreasing even when the heat sink and the heat conduction member is of separated construction.

14 Claims, 9 Drawing Sheets

COOLING MECHANISM, HEAT SINK, ELECTRONIC EQUIPMENT AND FABRICATION METHOD THEREFOR

BACKGROUND OF THE INVENTION

1. Field of the Invention

The present invention relates to a cooling mechanism, a heat sink and an electronic equipment for cooling an electronic component such as CPU or other heat generating elements and a fabrication method for the electronic equipment, and more particularly a cooling mechanism, a heat sink and an electronic equipment on which most suitable cooling mechanism can be mounted corresponding to the amount of the heat generated by an electronic component or other heat generating elements, and a fabrication method for the electronic equipment.

2. Description of the Related Art

Downsizing of electronic equipment such as a computer and the like having CPU have been remarkably improved with an increased performance. A heat is generated while an electronic component such as a CPU is in operation. Failure of heat dissipation from the electronic component may cause deteriorated performance of electronic components or in some cases result in a failure of the component itself. Cooling mechanism is required to prevent such condition. As electronic equipment is becoming smaller in size in recent years, a cooling space becomes narrower. Therefore cooling mechanism having high performance is desired.

Conventionally a heat sink has been used for a cooling mechanism of an electronic component such as a CPU (for example, as disclosed in Japanese Unexamined Patent Publication No. Hei-8-316384.) A heat sink is closely attached to the surface of an electronic component to dissipate heat therefrom. Either a cooling fin or both cooling fin and cooling fan are often used to improve the cooling capability.

However, when the electronic component produces large amount of heat, it is insufficient if heat sink only is used. For this reason, there has been proposed a method of using of an equipment frame which have a plate of large radiation area. The heat transferred in the heat sink is further transferred to a radiation plate (as an auxiliary cooling member) through a conduction member (for example, as disclosed in Japanese Unexamined Patent Publication No. Hei-10-107468). According to the disclosure, there is proposed a heat sink configured by a radiation plate to be pushed onto a CPU with a heat conduction member having resilient property.

In recent years, information processing equipment such as a notebook computer, desk-top PC, etc. has a high performance CPU which produces different heat amount (or consumes different power amount) depending on the operation frequency thereof. For example, a CPU having an operation frequency of 366 MHz (e.g. Intel Celeron 366) consumes power of approximately 9 W (watts), while another CPU having an operation frequency of 650 MHz (e.g. Intel P III 650) consumes power of approximately 14 W.

Meanwhile, low cost is strictly required for such information processing equipment. If a cooling mechanism corresponding to the highest power consumption among a series of CPUS is applied to a CPU which consumes small power, the equipment cost is undesirably increased. Therefore a cooling mechanism fit for the power consumption of a CPU in use is desirably applied. In addition, it is also desirable that major components of a cooling mechanism can be assembled at a later stage in order to meet a BTO (build-to-order) requirement in manufacturing information processing equipment.

In the conventional art, when a heat sink and a heat conduction pipe are separately configured, it is possible to select proper combination of a heat sink and a heat conduction pipe corresponding to the CPU capability. However, there is a problem that it is difficult to make the heat sink in surface contact with the CPU because this contact is comprised of that the heat conduction pipe itself pushes the heat sink toward the CPU. Such configuration results in inefficient thermal absorption against heat from the CPU.

Also, there is another problem, because a contact area between the heat sink and the heat conduction pipe is small, the heat in the heat sink is not efficiently transferred to the heat conduction pipe. Therefore cooling capability provided in the cooling mechanism cannot fully be utilized. This also results in difficulty to apply a low cost cooling mechanism for a CPU of low power consumption. To sum up, the problem hitherto is that the cost reduction is difficult when a separate configuration is applied.

SUMMARY OF THE INVENTION

It is therefore an object of the present invention to provide a cooling mechanism, a heat sink and an electronic equipment and a fabrication method of the electronic equipment, by which a decrease of the cooling capability is prevented even when a separated cooling mechanism is applied.

It is another object of the present invention to provide a cooling mechanism, a heat sink and an electronic equipment and a fabrication method of the electronic equipment, enabling to select a cooling mechanism fit for the power consumption of a electronic component.

It is still another object of the present invention to provide a cooling mechanism, a heat sink and electronic equipment and a fabrication method of the electronic equipment, enabling to reduce cost even in cooling mechanism of separate configuration.

In order to perform this object, a cooling mechanism of an electronic component and an electronic equipment according to the present invention includes: a heat sink being in contact with heat generating electronic component; a heat radiation plate for radiating heat; a heat conduction member for transferring the heat from the heat sink to the heat radiation plate; and a connection mechanism for connecting the heat sink and the heat conduction member and separating the heat sink and the heat conduction member.

According to an aspect of the present invention, a connection mechanism is provided for connecting the heat sink and the heat conduction member to be able to separate mutually. This enables the heat sink to be in surface contact independently to a heat-generating electronic component, to reduce thermal resistance between the heat sink and the electronic component. Also, the connection mechanism can reduce thermal resistance between the heat sink and the heat conduction member, enabling to prevent from deteriorating cooling capability even the heat sink is configured separately with the heat conduction member.

Therefore, a cooling mechanism fit for consumed power of an electronic component mounted to electronic equipment can be provided with low cost, even configured with a separated structure. In addition, a cooling mechanism provided with removable configuration by the connection mechanism enables easy exchange of an electronic component for grade-up or a heat sink after the equipment is shipped.

Further, the connection mechanism according to the present invention is provided to connect the heat sink and the heat conductive member such that the heat sink rotates around the heat conduction member, thereby enabling to exchange or mount the electronic component without removing the heat sink and the heat conduction member. This enables to exchange or mount the electronic component maintaining thermal transfer resistance between the heat sink and the heat conduction member of a manufacturing stage.

Still further, in the electronic equipment and the cooling mechanism according to the present invention, the connection mechanism is provided with support members for supporting the heat conduction member, and a pressing member removably provided against the support members for maintaining the heat conduction member between the support members. The fabrication method of the present invention includes the steps of; setting the heat conduction member of equipment frame to mount the electronic component, and attaching the removable heat conduction member to a support portion of the heat sink. By providing the support portion, thermal conduction resistance between the heat sink and the heat conduction member can be kept small when connection is made therebetween.

Also, in the electronic equipment, the heat sink and the cooling mechanism according to the present invention, the support portion is constructed integrally with the heat sink. This enables to reduce thermal conduction resistance between the heat sink and the heat conduction member, as well as the reduced number of component even if the connection mechanism is provided.

Further scopes and features of the present invention will become more apparent by the following description of the embodiments with the accompanied drawings.

DETAILED DESCRIPTION OF THE PREFERRED EMBODIMENTS

The preferred embodiments of the present invention are described hereinafter referring to the charts and drawings wherein like numerals or symbols refer to like parts. Explanation on electronic equipment, cooling mechanism and other embodiments is independently described.

ELECTRONIC EQUIPMENT

Figure 1:
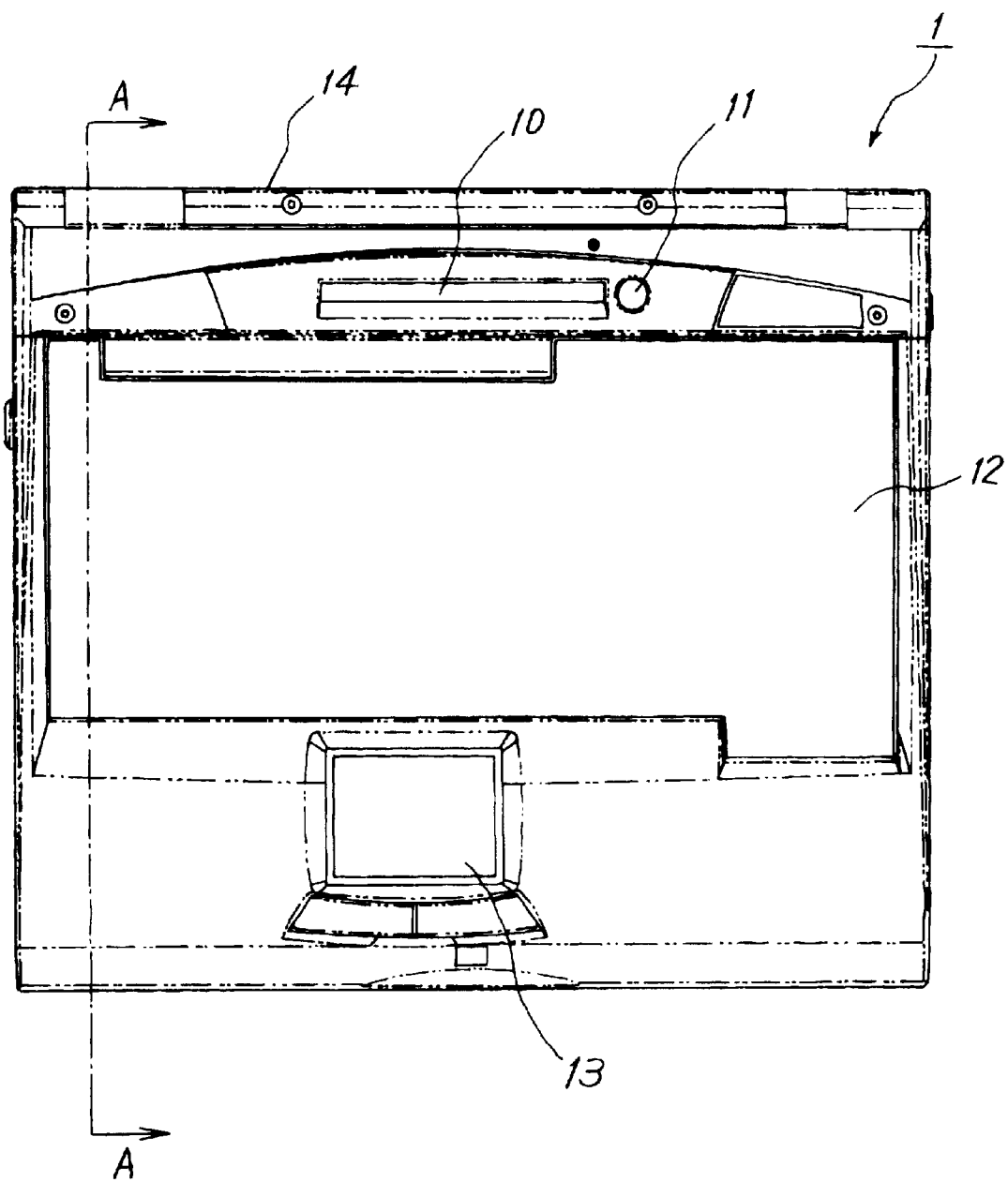
FIG. 1 is a top plan view of electronic equipment according to an embodiment of the present invention.

In FIG. 1, there is shown a top plan view of electronic equipment according to an embodiment of the present invention.

Figure 2:
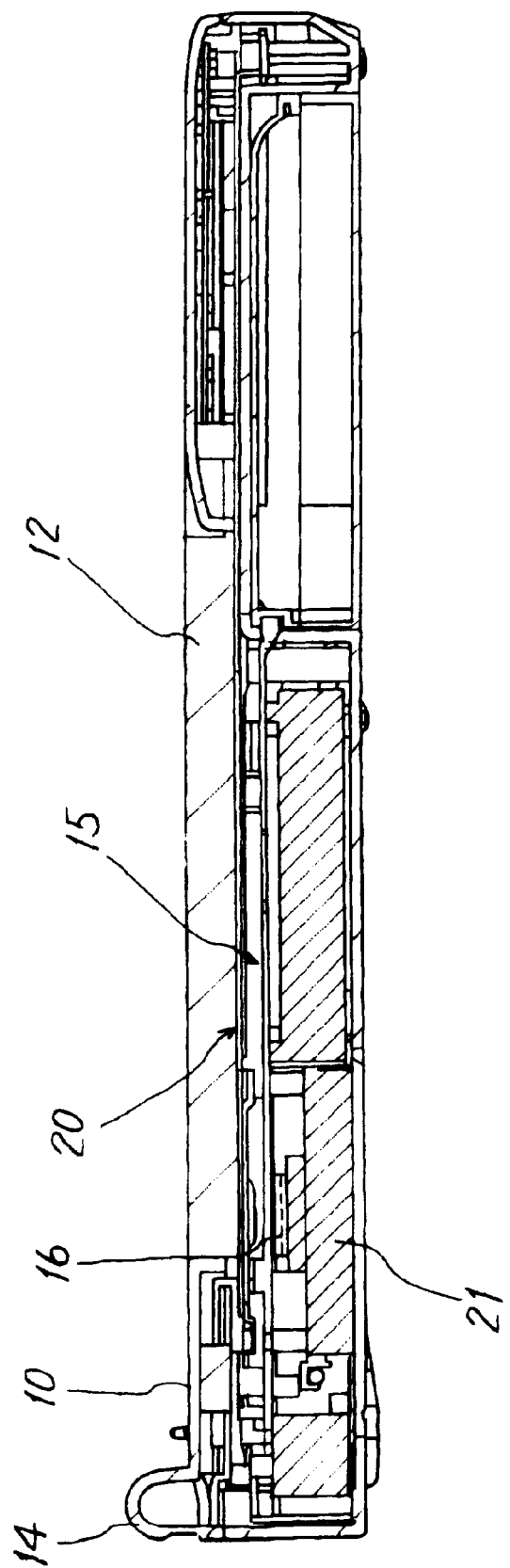
FIG. 2 is a cross-sectional view of A—A of the equipment shown in FIG. 1.

In FIG. 2, an A—A cross-sectional view of the electronic equipment is shown. Here, a notebook type personal computer (notebook PC) is given as an example of the electronic equipment.

As shown in FIG. 1, a notebook PC 1 is provided with display portion (LCD) 10, a resume switch 11, a keyboard 12 (consisting of a plurality of keys, not shown), a flat-type pointing device 13, and a covered outer cover panel 14. In FIG. 1, a flat display (LCD, not shown) which can be open and close is mounted the outer cover panel 14 of computer 1.

As shown in the cross-sectional diagram of FIG. 2, an equipment frame 20 is provided in computer 1. The equipment frame 20 supports equipment portions as well as improves physical strength of the equipment. The equipment frame 20 also functions as a heat radiation plate, as explained later.

In FIG. 2, a printed circuit board 15 is mounted the equipment frame 20. The printed circuit board 15 is provided with an IC socket to mount a CPU 16. To dissipate heat generated by CPU 16, a heat sink 21 is provided in surface contact with CPU 16. As explained later, heat sink 21 is thermally connected with radiation plate 20 through heat conduction pipe 22.

In such computers, various models having different grade of CPU are provided, such as 366 MHz CPU (e.g. Intel Celeron 366, Intel P II 366) model, 500 MHz CPU (e.g. Intel P III 500) model, 650 MHz CPU (e.g. Intel P III 650) model, etc. Each CPU has different maximum power consumption i.e. approximately 9 W, 11 W and 14 W, respectively.

In order to provide heat sink 21 fit for the CPU having the largest power consumption, the heat sink 21 requires a cooling capability of approximately 16 W. In case this heat sink 21 is applied to a CPU having low power consumption (such as 366 MHz CPU), cooling capability becomes excessive. This results in not only higher equipment cost but also larger power consumption for cooling (in the cooling fan). This further makes it difficult to realize a mobile terminal capable of battery operation for long hours.

Therefore, it is required to mount a cooling mechanism fit for power consumption of the CPU in the equipment to reduce cost and power consumption for cooling. Namely, the heat sink 21 and the heat conduction pipe 22 are selectably configured to fit for the CPU power consumption, under the condition that an equipment frame is used for radiation plate 20 which is unchangeable.

In the above explanation, a notebook PC is taken as an example of the electronic equipment. It may also be applicable for other electronic equipment having a CPU, such as a desk-top computer, a personal digital assistance and so forth.

COOLING MECHANISM

Figure 3:
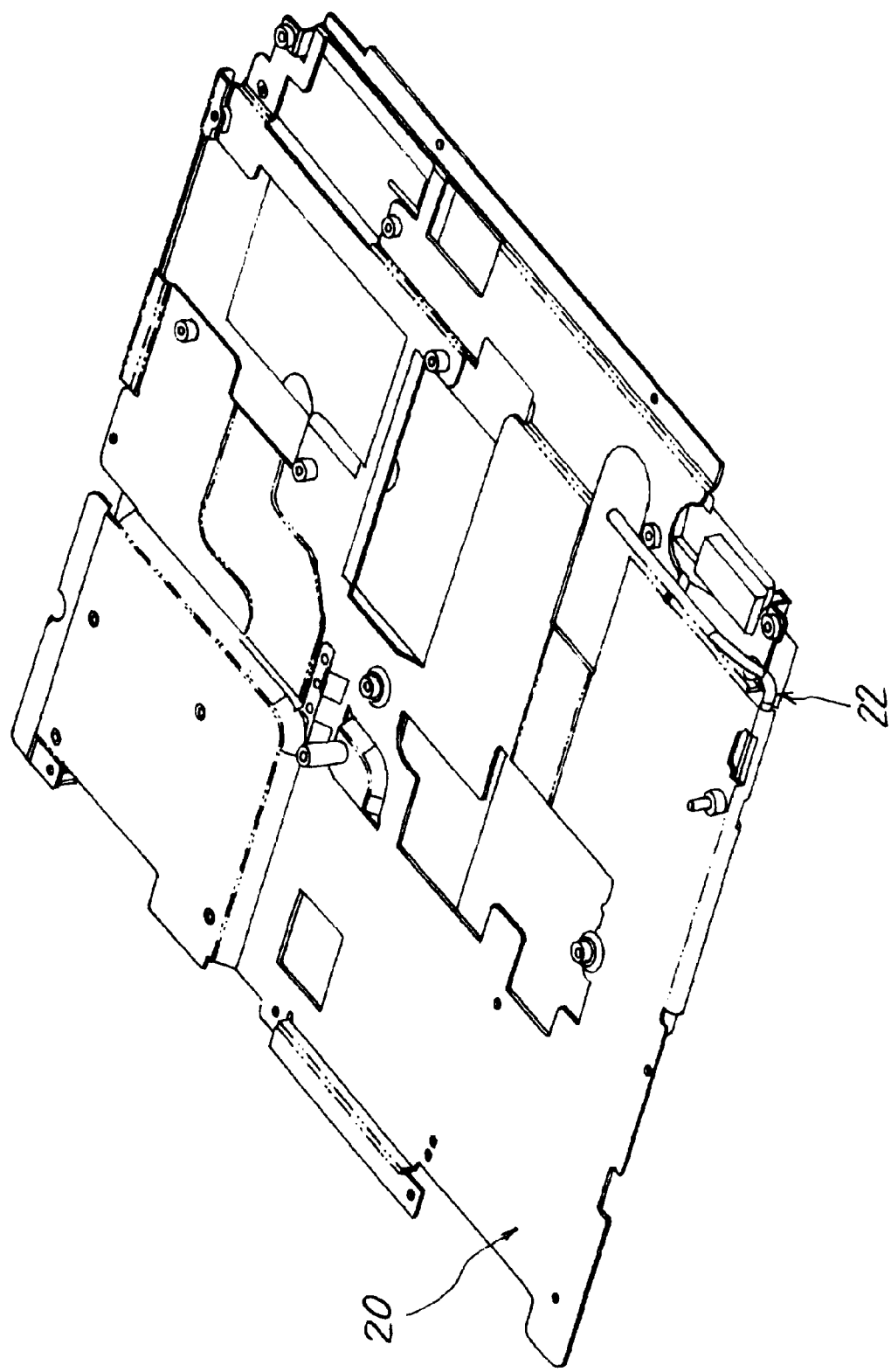
FIG. 3 is a perspective view of an equipment frame shown in FIG. 2.
Figure 4:
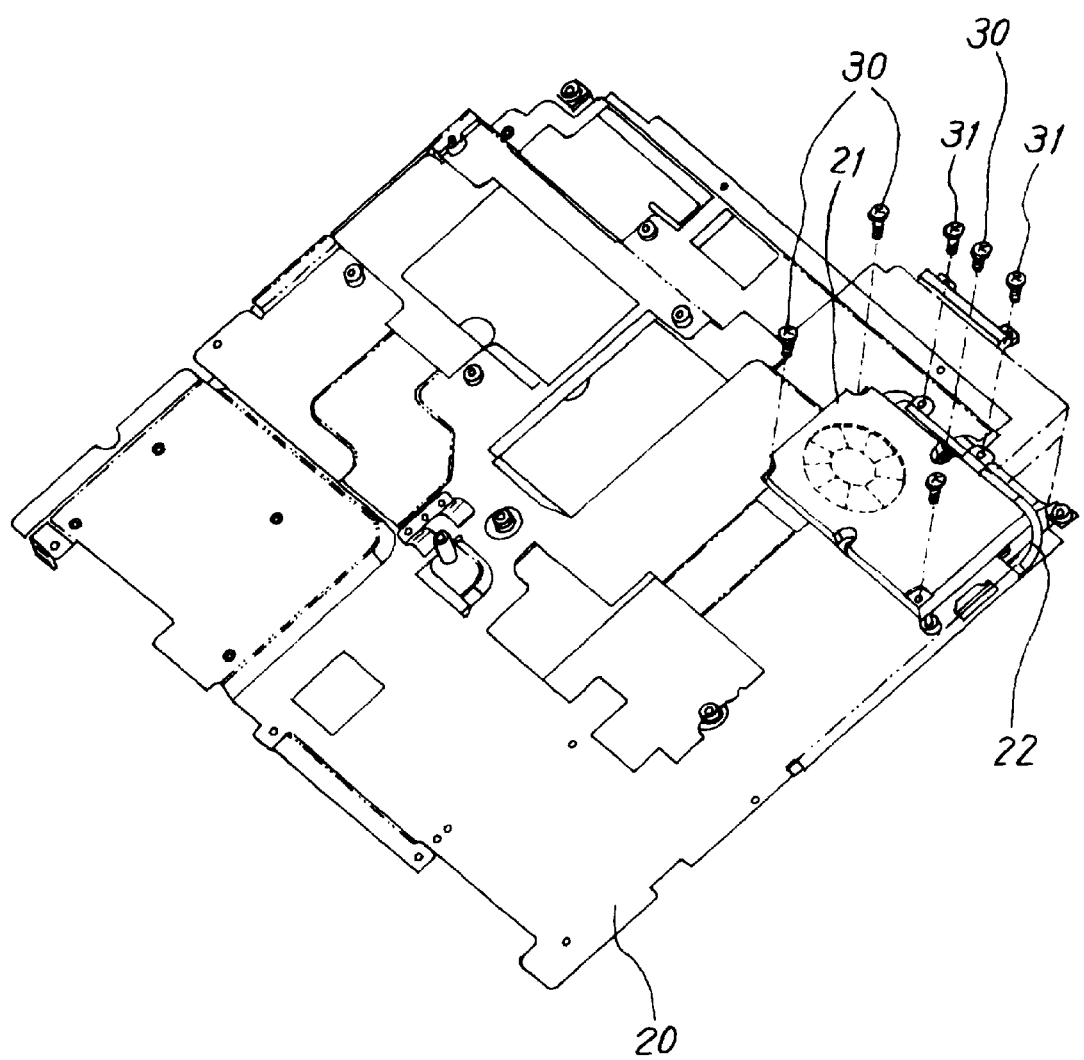
FIG. 4 is a diagram illustrating a heat sink mounted on the equipment frame shown in FIG. 2.
Figure 5:
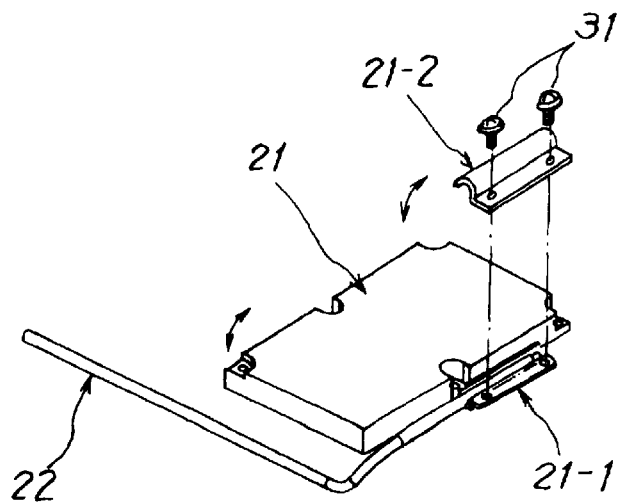
FIG. 5 is a configuration diagram of a connection mechanism shown in FIG. 4.
Figure 6:
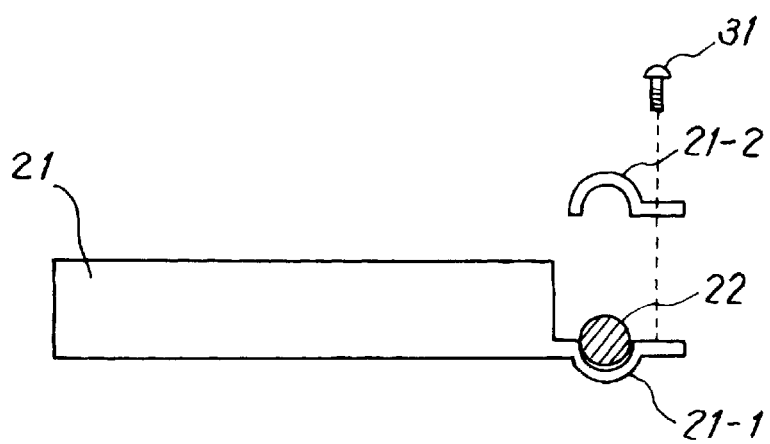
FIG. 6 is a cross-sectional view of the connection mechanism shown in FIG. 4.
Figure 7:
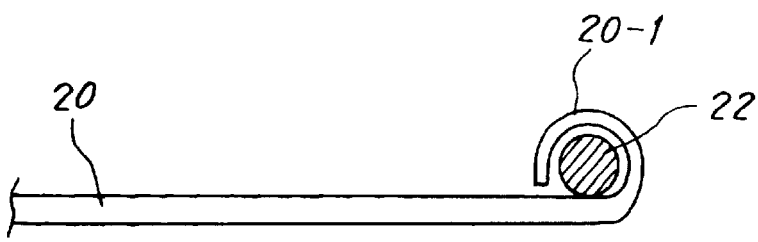
FIG. 7 is a connection diagram of the equipment frame and heat conduction pipe shown in FIG. 3.
Figure 8:
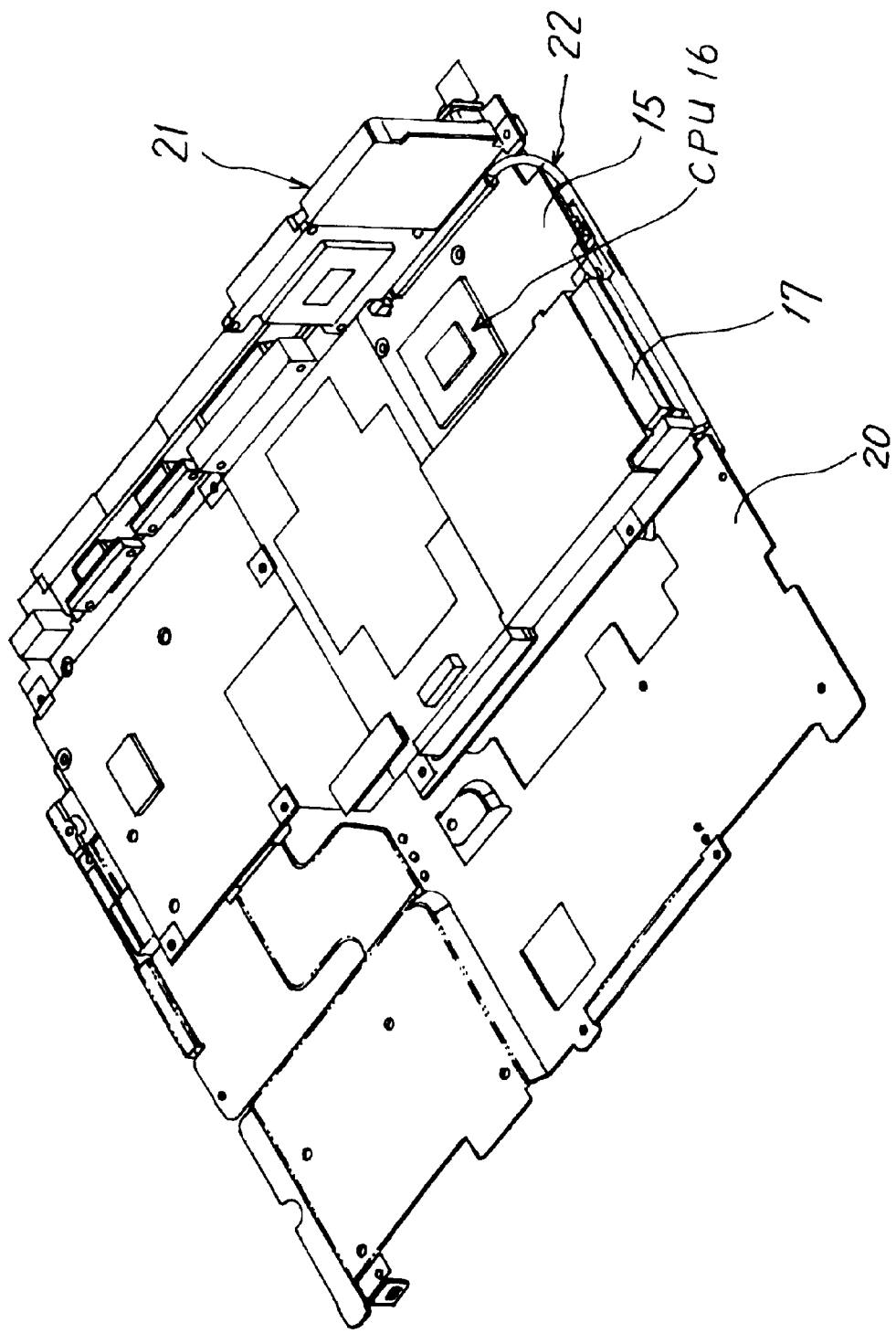
FIG. 8 is a diagram illustrating the heat sink and CPU mounted on the equipment frame shown in FIG. 2.

In FIG. 3, a perspective view of equipment frame (radiation plate) 20 is shown. Further, in FIG. 4 there is illustrated a diagram in which the heat sink 21 is attached to the equipment frame 20 shown in FIG. 3. FIG. 5 is a configuration diagram of the connection mechanism between the heat sink 21 and the heat conduction pipe 22. FIG. 6 is a cross-sectional view of the connection mechanism. FIG. 7 is a diagram by which connected state between the heat conduction pipe 22 and the equipment frame 20 is shown. FIG. 8 is an operational diagram thereof.

Referring to FIG. 3, there is shown a perspective view from the bottom of the equipment frame 20 in FIG. 2, wherein the heat conduction pipe 22 is provided at an end. As the heat conduction pipe 22, a shaft material of copper type or heat pipe may selectably be used. As shown in FIG. 7, an end of the heat conduction pipe 22 is secured to the frame 20 by means of a winding portion 20-1 of the frame 20. This enables the heat conduction pipe 22 to be covered by the frame 20, producing large surface contact area between the frame 20 and the heat conduction pipe 22 with very small heat conduction resistance of, for example, approximately 0.4° C./W.

As shown in FIG. 8, the printed circuit board 15 is mounted on the frame 20 shown in FIG. 3, and the CPU 16 is mounted on an IC socket 18 (refer to FIG. 9) provided on this printed circuit board 15. In FIG. 8, there is shown a card slot mechanism 17 mounted adjacent to the printed circuit board 15.

As shown in FIG. 8, the other end of the heat conduction pipe 22 is extended adjacent to the CPU 16. As shown in FIG. 3, the heat sink 21 is provided on the CPU 16 and secured to the printed circuit board 15 by a screw 30 at totally four points on the right and left sides. This enables the heat sink 21 to be in surface contact with the CPU 16 thus having a large contact area and small heat conduction resistance against the CPU 16. For example the heat conduction resistance is approximately 0.5° C./W, which can further be reduced by applying grease etc. onto the contact face. The configuration of the heat sink 21 is explained later.

The heat sink 21 is connected with the heat conduction pipe 22 through a connection mechanism. As shown in FIG. 5 and FIG. 6, the heat sink 21 is provided with a support portion 21-1 for supporting the heat conduction pipe 22. This support portion 21-1 is constructed integrally with a main body of the heat sink 21, formed of, for example, copper or aluminum.

The support portion 21-1 provides a hollow for the housing heat conduction pipe 22. A pressing member 21-2 is provided on the support portion 21-1 for sandwiching the heat conduction pipe 22. The pressing member 21-2 is secured to the support portion 21-1 with a screw 31.

With this configuration, the support portion 21-1 and the pressing member 21-2 cover the heat conduction pipe 22, producing large contact area which reduces thermal conduction resistance between the heat sink 21 and the heat conduction pipe 22 of, for example, approximately 0.4° C./W. In addition, by applying grease etc. onto the contact face, smaller thermal conduction resistance can be obtained.

Figure 9:
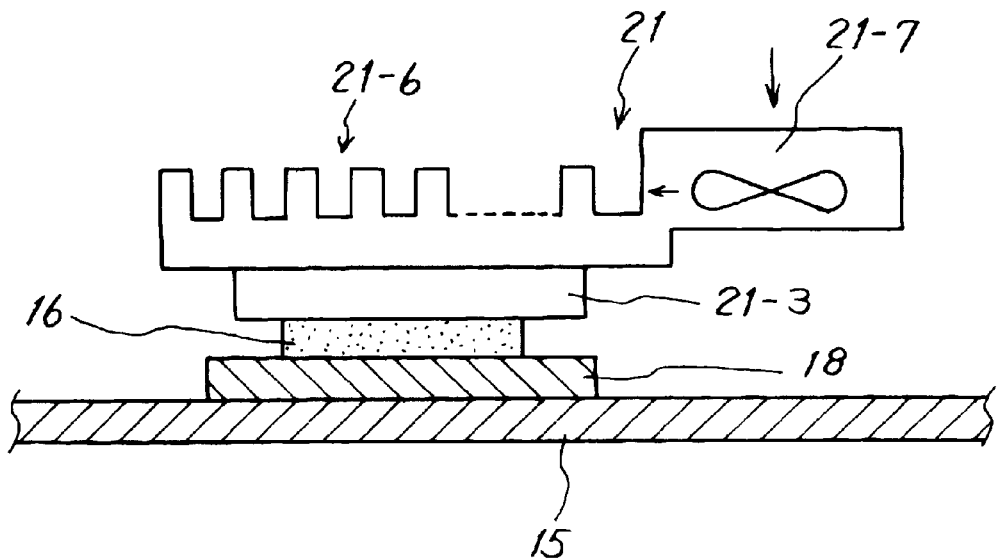
FIG. 9 is a cross-sectional view of the mount state shown in FIG. 8.
Figure 10:
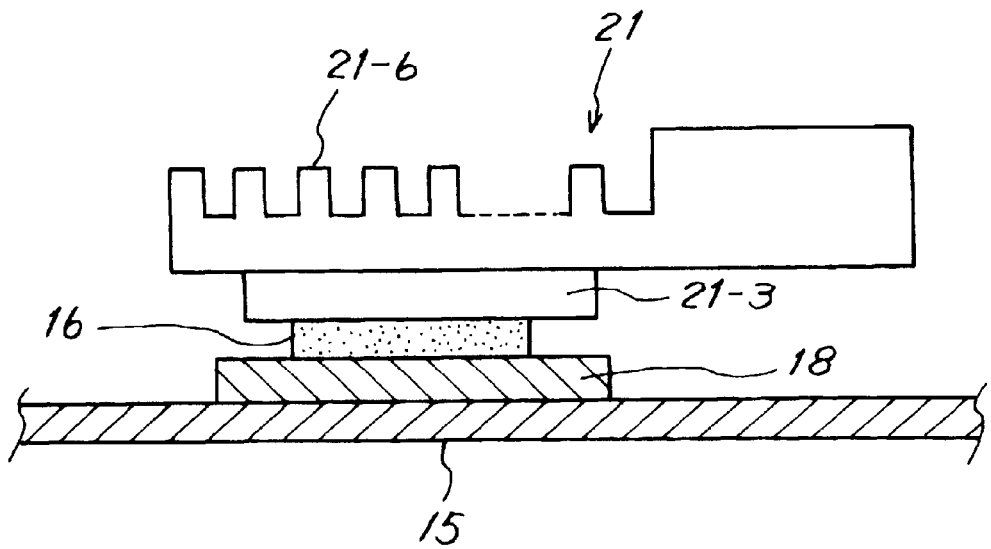
FIG. 10 is another cross-sectional view of the mount state shown in FIG. 8.

In FIG. 9 and FIG. 10, a diagram of the mounted heat sink is shown. The heat sink 21 shown in FIG. 9 includes a heat receiving plate 21-3 in surface contact with CPU 16, a radiation fin 21-6 and a radiation fan 21-7. The radiation fan 21-7, as an example, takes air in from upper area in the figure and exhaust to the horizontal direction so that it is effective to the cool radiation fin 21-6. The heat sink 21 shown in FIG. 10 is provided with the radiation fin 21-6 and the heat receiving plate 21-3.

As explained above, the heat sink 21 and the heat conduction pipe 22 have a separate structure which enables to configure the heat sink 21 and the heat conduction pipe 22 with an arbitrary combination fit for the power consumption of CPU 16. For example, when CPU 16 having high power consumption is used, a cooling fin and a cooling fan shown in FIG. 9 is adopted to configure the heat sink 21. On the other hand, when CPU 16 having low power consumption is used, only cooling fin shown in FIG. 10 is adopted as the heat sink 21. In addition, it is also possible to provide heat sink having a cooling fan of various cooling capacity. In conclusion, either of the above can be applied as a heat sink.

Needless to say, a heat sink having a cooling fan costs higher, and heat sink having greater cooling capability costs even higher. As for a heat conduction pipe, either a copper shaft, a heat pipe or the like are applicable. The heat pipe has higher thermal transmittance and the cost is also higher. Therefore it is possible to provide a suitable heat conduction pipe corresponding to power consumption of CPU 16. It is also possible to provide a heat sink without a heat conduction pipe.

Accordingly, it is possible for electronic equipment to provide with a cooling mechanism having well balanced cost and performance. Also, when BTO (build to order) system is adopted, the number of inventory parts can be reduced because various types of cooling mechanism can be provided by the combinations of the heat sink 21 and the heat conduction pipe 22. In addition, implementing the cooling mechanism after the fabrication of the equipment is effective in shortening delivery time.

Furthermore, because the heat sink and the heat conduction pipe are separatably connected, the heat sink can firmly be contacted with the CPU. This produces a large contact area with a small heat conduction resistance. At the same time, the use of connection mechanism realizes to have a large contact area between the heat sink and the heat conduction area. This also produces small heat conduction resistance for a separated configuration. Accordingly it is possible to minimize loss of cooling capability of the cooling mechanism even in spite of using a separated configuration. Therefore, the cooling mechanism can be realized with a smaller cost.

Figure 11:
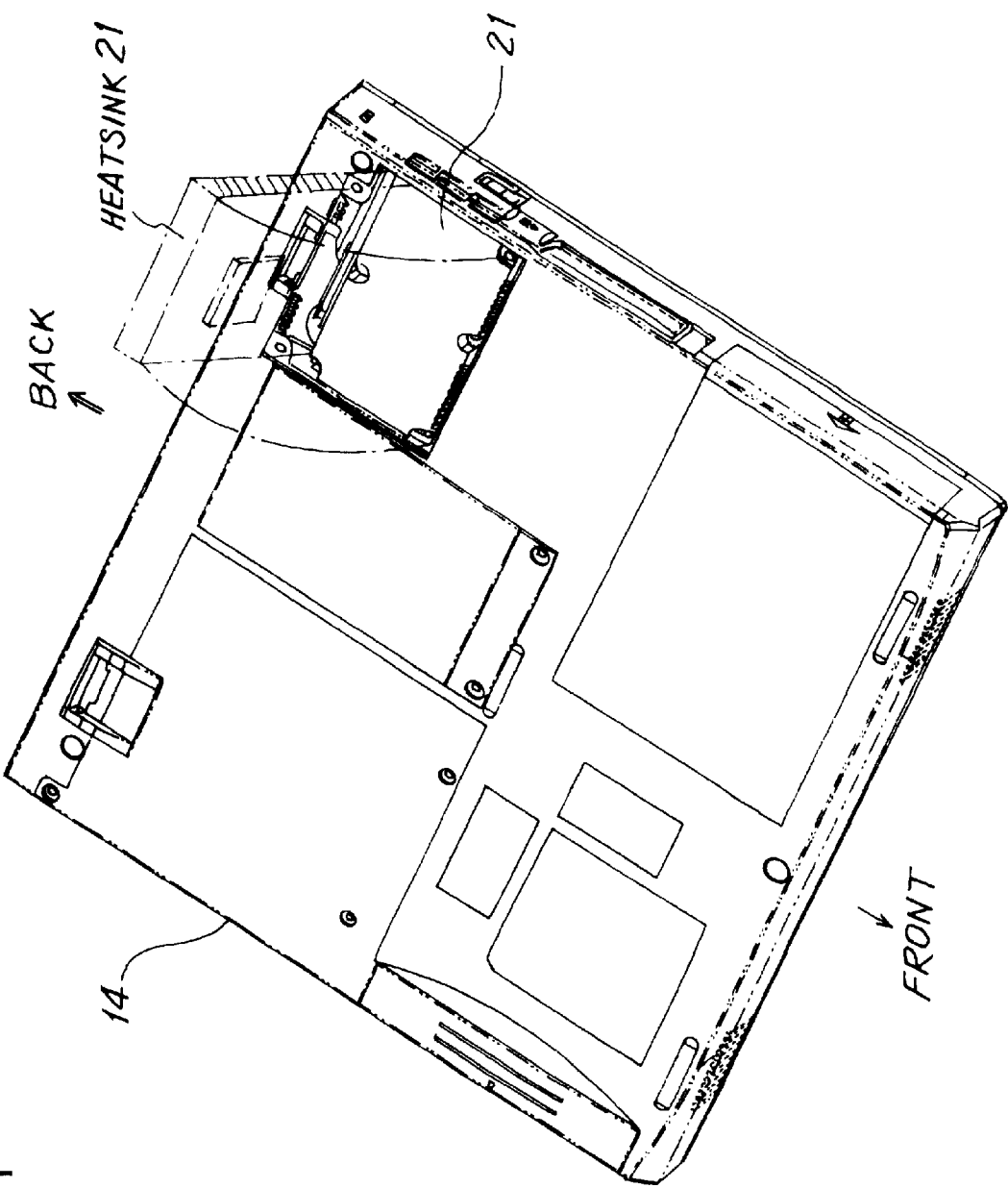
FIG. 11 shows an exchange operation after the shipment.

In addition, the heat sink of the present invention is connected to rotate against the heat conduction pipe. Namely, as shown in FIG. 11, by detaching the screw 30 from the heat sink 21 after the shipment of the equipment, the heat sink 21 can be rotated around the heat conduction pipe. Thus CPU 16 is exposed, making it easy to exchange CPU 16. This facilitates easy replacement of the CPU for upgrading or substitution in the event of fault.

At this time, the connection mechanism keeps connection between the heat sink and the heat conduction pipe. Therefore, heat conduction resistance at the time of factory assembling can be maintained. For example, grease applied at the assembly aimed to reduce heat conduction resistance is not lost. Also, because the heat sink is so configured to be separable from the heat conduction pipe, even when using a heat sink with a fan which is apt to become faulty, replacement can be realized merely by detaching screw 31.

Taking examples of the models by use of 366 MHz CPU (e.g. Intel Celeron 366, or Intel P II 366), 500 MHz CPU (e.g. Intel P III 500) and 650 MHz CPU (e.g. Intel P III 650) model, these CPU have different maximum power consumption of 9 W, 11 W and 14 W, respectively. Therefore corresponding to each CPU, a heat sink having fan capabilities of either 12 W, 14 W or 16 W is applied. For a CPU having less power consumption than the aforementioned CPUs, a heat sink having no fan is applied. This brings about an increased battery time usable for the portable equipment because of small power consumption of the heat sink.

ANOTHER EMBODIMENT

Figure 12:
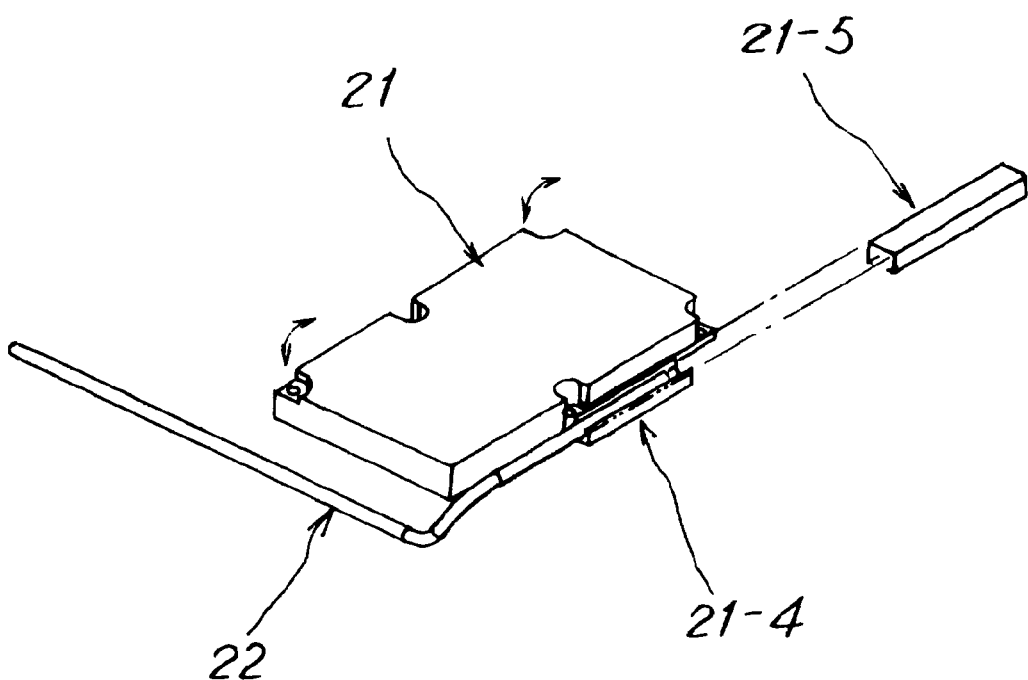
FIG. 12 is a configuration diagram of another embodiment of the connection mechanism.

In FIG. 12, a configuration diagram of another embodiment of the present invention is shown. In this figure there is illustrated another example of a connection mechanism between the heat sink 21 and the heat conduction pipe 22. The heat conduction pipe 22 is inserted to a support portion 21-4 provided in the heat sink 21. A pressing member 21-5 formed of a resilient material is inserted to the support portion 21-4.

In this example the pressing member 21-5 enables to hold the heat conduction pipe 22 resiliently. Therefore, mounting by the screw 31 is not needed, opposed to the example shown in FIG. 5. This enables easy assembling or detaching.

In addition to the embodiments shown above, the following modification is possible in the present invention:

(1) As an electronic component, there has been shown a CPU as an example of heat generating portion. It may also be possible to apply this invention to other components, such as an MPU, DSP, IC for power management, IC chip for controlling DC/DC converter, or IC for image processing.

(2) In the above explanation, a notebook PC is used as electronic equipment. In the present invention it is also applicable to personal terminal, portable telephone or other electronic equipment.

The foregoing description of the embodiments is not intended to limit the invention to the particular details of the examples illustrated. Any suitable modification and equivalents may be resorted to the scope of the invention.

The effect of the present invention is summarized below:

Because of the provision of connection mechanism for separatably connecting a heatsink with a heat conduction member, the heat sink can be in surface contact with an electronic component independently when the heat sink is separated from the heat conduction member. This enables to reduce heat conduction resistance between the heat sink and the heat conduction member. Also, because of providing the connection mechanism, small heat conduction resistance between the heat sink and the heat conduction member can be maintained. The cooling capability is not reduced even when the heat sink and the heat conduction are separated each other.

For the above reason, it is possible to provide with low cost a cooling mechanism which fits power consumption of electronic components in use in spite of the separate configuration. When the BTO (build to order) system is applied, it is possible to provide electronic equipment having a cooling mechanism which fits power consumption of electronic components in use with low cost and in short manufacturing period. In addition, because the cooling mechanism of the invention is configured with removable mechanism, substitution of electronic components either for upgrading or for replacement of the heat sink is easy after the equipment is shipped.

Other features and advantages of the invention which fall within the scope of the invention are covered by the appended claims.

What is claimed is:

1. A cooling mechanism for cooling a heat generation element comprising:
    a heat sink being thermally in contact with said heat generation element;
    a heat radiation plate for radiating a heat;
    a heat conduction member for transferring said heat from said heat sink to said heat radiation plate; and
    a connection member for connecting said heat sink and said heat conduction member and separating each other;
    wherein said connection mechanism connects said heat sink such that said heat sink rotates around said heat conduction member functioning as fulcrum;
    wherein said connection mechanism comprises:
        a support portion connected to said heat sink for supporting said heat conduction member; and
        a pressing member attached and removed to said support portion and for holding said heat conduction member between said support portion and said pressing member.

2. The cooling mechanism according to claim 1 wherein said support portion is integrally constructed with said heat sink.

3. The cooling mechanism according to claim 1 wherein said heat sink is for cooling an electronic element as said heat generating element.

4. The cooling mechanism according to claim 3 wherein said heat sink is for cooling a processor as said heat generating element.

5. The cooling mechanism according to claim 1, wherein said heat conductive member comprises a heat conductive pipe.

6. The cooling mechanism according to claim 1, wherein said connection member further comprises a screw for connecting said pressing member and said support portion.

7. A heat sink for cooling heat generation element comprising:
    a heat sink main body;
    a support portion provided on said heat sink main body and for supporting a heat conduction member for transferring heat to a heat radiation plate;
    a pressing member removed and attached to said support portion and for holding said heat conduction member between said support member and said pressing member;
    wherein said connection mechanism connects said heat sink such that said heat sink rotates around said heat conduction member functioning as fulcrum.

8. The heat sink according to claim 7 wherein said support portion is integrally constructed with said heat sink.

9. An electronic equipment having a heat generation element, comprising:
    a heat sink being thermally in contact with said heat generation element;
    a heat radiation plate for radiating heat;
    a heat conduction member for transferring heat from said heat sink to said heat radiation plate; and
    a connection mechanism for connecting said heat sink and said heat conduction member and separating said heat sink and said heat conduction member;
    wherein said connection mechanism connects said heat sink such that said heat sink rotates around said heat conduction member functioning as fulcrum; and
    wherein said connection mechanism comprises:
        a support portion for supporting said heat conduction member; and
        a pressing member removed and attached to said support portion for holding said heat conduction member between said support portion and said pressing member.

10. The electronic equipment according to claim 9 wherein said support portion is integrally constructed with said heat sink.

11. The electronic equipment according to claim 9 wherein said heat radiation plate is constituted by an equipment frame.

12. The electronic equipment according to claim 9 wherein said heat sink is for cooling an electronic element as said heat generating element.

13. The electronic equipment according to claim 12 wherein said heat sink is for cooling a processor as said heat generating element.

14. An electronic equipment comprising:
- an electronic element;
- a heat sink being thermally in contact with said electronic element;
- an equipment frame;
- a heat conduction member arranged an edge of said heat sink and transferring heat from said heat sink to said equipment frame;
- a connection mechanism for connecting said heat sink and said heat conduction member and separating said heat sink and said heat conduction member.

* * * * *